United States Patent
Babic et al.

(10) Patent No.: US 9,614,622 B2
(45) Date of Patent: Apr. 4, 2017

(54) WAVELENGTH-REUSE FIBER-OPTIC TRANSMITTERS

(71) Applicants: Dubravko Babic, Milpitas, CA (US); Tin Komljenovic, Zagreb (HR); Zvonimir Sipus, Zagreb (HR)

(72) Inventors: Dubravko Babic, Milpitas, CA (US); Tin Komljenovic, Zagreb (HR); Zvonimir Sipus, Zagreb (HR)

(*) Notice: Subject to any disclaimer, the term of this patent is extended or adjusted under 35 U.S.C. 154(b) by 0 days.

(21) Appl. No.: 14/860,968

(22) Filed: Sep. 22, 2015

(65) Prior Publication Data

US 2016/0036531 A1 Feb. 4, 2016

Related U.S. Application Data

(60) Provisional application No. 61/674,855, filed on Jul. 24, 2012.

(51) Int. Cl.
*H04B 10/04* (2006.01)
*H04B 10/548* (2013.01)
(Continued)

(52) U.S. Cl.
CPC .......... *H04B 10/548* (2013.01); *G02B 6/00* (2013.01); *G02B 6/29347* (2013.01); *G02F 1/09* (2013.01); *H01S 5/041* (2013.01); *H04B 10/2587* (2013.01); *H04B 10/272* (2013.01); *H04J 14/0265* (2013.01); *G02B 6/12009* (2013.01);
(Continued)

(58) Field of Classification Search
CPC .... H04B 10/548; H04B 10/505; H04B 10/54; H04B 10/2587; H04B 10/272; H04B 10/2914; H04B 10/50; H04B 10/541; G02B 6/00; G02B 6/29347; G02B 6/12009; G02F 1/09; G02F 2001/0139; H01S 5/041; H01S 5/0656; H04J 14/0265
USPC ....... 398/182, 183, 186–189, 192, 195, 198, 398/197, 200
See application file for complete search history.

(56) References Cited

U.S. PATENT DOCUMENTS 8,559,775 B2 * 10/2013 Babic ............... G02B 6/2817 385/27
8,970,945 B2 * 3/2015 Komljenovic ......... H01S 5/041 250/227.12
9,203,211 B2 * 12/2015 Gottwald ............. H01S 5/0085
(Continued)

OTHER PUBLICATIONS

Modulation-Averaging Reflectors for Extended-Cavity Optical Sources Tin Komljenovic´, Dubravko Babic´, Senior Member, IEEE, and Zvonimir ˇSipuˇs, Member, IEEE Journal of Lightwave Technology, vol. 29, No. 15, Aug. 1, 2011.*

*Primary Examiner* — Hibret Woldekidan
(74) *Attorney, Agent, or Firm* — Shalini Venkatesh

(57) ABSTRACT

A fiber-optic transmitter comprises a transmitter optical port, an optical circulator, a semiconductor optical amplifier, and a two-port modulation-averaging structure. The optical circulator has at least three ports, a first one of the three circulator ports being optically coupled to the transmitter optical port. The semiconductor optical amplifier has an input optical port, an output optical port, and an electrical input port. The two-port modulation-averaging structure is optically coupled between the input optical port and a third one of the three circulator ports.

2 Claims, 9 Drawing Sheets

U-B

U-U

(51) Int. Cl.
*H01S 5/04* (2006.01)
*G02B 6/00* (2006.01)
*H04B 10/2587* (2013.01)
*H04B 10/272* (2013.01)
*G02B 6/293* (2006.01)
*G02F 1/09* (2006.01)
*H04J 14/02* (2006.01)
*H01S 5/065* (2006.01)
*G02B 6/12* (2006.01)
*G02F 1/01* (2006.01)

(52) U.S. Cl.
CPC .... *G02F 2001/0139* (2013.01); *H01S 5/0656* (2013.01)

(56) References Cited

U.S. PATENT DOCUMENTS

| | | | |
|---|---|---|---|
| 2004/0175188 A1* | 9/2004 | Bellemare | H04B 10/505 398/186 |
| 2005/0111848 A1* | 5/2005 | Grubb | G02B 6/12007 398/147 |
| 2007/0154130 A1* | 7/2007 | Tam | G01B 11/18 385/12 |
| 2008/0181266 A1* | 7/2008 | Deladurantaye | H01S 3/06758 372/25 |
| 2009/0310627 A1* | 12/2009 | Chen | H01S 5/146 372/6 |
| 2010/0073763 A1* | 3/2010 | Chen | H01S 5/50 359/337.2 |
| 2010/0142950 A1* | 6/2010 | Pincemin | H04B 10/66 398/58 |
| 2010/0142962 A1* | 6/2010 | Poustie | H04J 14/02 398/91 |
| 2011/0182578 A1* | 7/2011 | Cavaliere | H04B 10/2587 398/58 |
| 2012/0020616 A1* | 1/2012 | Babie | H04J 14/02 385/27 |
| 2012/0293856 A1* | 11/2012 | Onaka | H01S 3/235 359/276 |
| 2014/0355990 A1* | 12/2014 | Salleh | H04B 10/2587 398/79 |
| 2015/0002851 A1* | 1/2015 | Takada | H01L 43/10 356/479 |

* cited by examiner

WAVELENGTH-REUSE FIBER-OPTIC TRANSMITTERS

FIELD OF THE INVENTION

The present invention relates to fiber-optic transmitters and transceivers for wavelength-division multiplexed optical networks, and more particularly to wavelength-reuse fiber-optic transmitters and transceivers employing modulation averaging and network architectures that use these components.

BACKGROUND OF THE INVENTION

Wavelength-division multiplexing (WDM) is a technology which multiplexes a number of optical carrier-signals onto a single optical fiber by using different wavelengths of light. This technique enables bidirectional communications over one strand of fiber as generally separate wavelength sets are for different communication directions.

Access networks are presently experiencing rapid growth around the world. Both residential and business customers are demanding increasingly higher bandwidths from their Internet service providers who in turn are pressed to implement networks capable of delivering bandwidths in excess of 100 Mb/s per customer. For this application, passive-optical-networks (PON) are particularly well suited as they feature lowest capital-equipment expenditures relative to point-to-point and active optical networks. The book by C. F. Lam, *Passive Optical Networks: Principles and Practice*, Academic Press, 2007, and publication by C-H. Lee, W. V. Sorin, and B. Y. Kim, "Fiber to the Home Using a PON Infrastructure", *IEEE J. Lightwave Technol.*, vol. 24, no. 12, pp. 4568-4583, 2006 give good introduction into this technology. Wavelength division multiplexing in passive optical networks (WDM-PON) is one of the actively investigated as next-generation optical network architecture. WDM-PON potentially offers the lowest cost per unit of bandwidth to the user. However, the key difficulty in such a system has been the cost of the components, particularly arising from the need to transmit light at one wavelength for a specific channel and also receive information at any one of several other wavelengths at the user end in the so-called optical network unit (ONU). WDM optical and optoelectronic components traditionally exhibit high cost, among other issues, due to the requirement for precise wavelength adjustment in such systems. A dramatic cost reduction is achieved by eliminating wavelength-specific transceivers at the ONU in the colorless WDM-PON system, also referred to as a system with wavelength-agnostic transceivers in the ONU.

In a colorless optical network, the wavelengths emitted and received by the transceiver in the ONU are defined in the remote node or the central office rather than in the transceiver at the ONU as is well known in the art—see book by Lam cited above. The spectral filtering is done by an array-waveguide gratings (AWG) placed in the remote node and in the central office. AWG is a passive optical component that is ubiquitous in optical networking used for filtering, separating, combining, and routing signals of different wavelengths as is well known in the art. Its use and principle of operation is described in publicly available texts, such as, "*WDM Technologies: Passive Optical Components*" by A. K. Dutta, N. K. Dutta, and M. Fujiwara, published by Academic Press in 2003. The physical properties of the dielectrics used in building the AWG are temperature dependent and consequently this temperature sensitivity results in a shift of the filter wavelengths. It is well known in the art today that this temperature variation can be efficiently compensated resulting in so-called athermal array-waveguide gratings with very low temperature coefficient of filter wavelength drift. This technology is described in publicly available texts such as "Recent Progress on Athermal AWG Wavelength Multiplexer" by Shin Kamei published at the *Optical Fiber Communications conference* in San Diego, Calif. in 2009.

In PON architectures, information travels in two directions: downstream direction refers to information flow from the central office (OLT) to the end-user (ONU), while the opposite direction is referred to as upstream data flow. The primary cost concern in WDM-PON systems is related to the equipment placed at the user premises (ONU). Hence providing a reasonably priced colorless ONU to be placed at user premises is of high interest. The cost is furthermore reduced by reusing wavelengths: one wavelength or both upstream and downstream signals. Networks with wavelength-reuse are described in numerous publicly available texts such as B. W. Kim, "RSOA-Based Wavelength-Reuse Gigabit WDM-PON", *J. of the Opt. Soc. of Korea.*, vol. 12, no. 4, pp. 337-345, 2008, and S.-H. Cho, H. H. Lee, J.-H. Lee, J.-H. Lee, S.-I. Myong, S.-S. Lee, "A Loopback WDM-PON Technology Based on RSOA Using Wavelength Reuse Scheme and It's Commercialization Status in Korea", $10^{th}$ International Conference on Optical Internet (COIN2012), May 29-31, 2012, paper WF.1, Yokohama, Japan.

FIG. 1 illustrates an example of prior art in this field. An optical network using wavelength-reuse 100 comprises of a central office 101, trunk fiber 102, remote node 103, a distribution fiber 104, and at least one optical network unit 105 (also referred to as the client terminal). The central office 101 comprises of a multiplicity (only one is shown in FIG. 1) of optical sources 110 emitting a modulated optical signal that is passed through a circulator 112, coupled to one port of an array-waveguide grating 113 before it is emitted through the trunk fiber 102 over a distance to the remote node 103 where it is spectrally demultiplexed using an array waveguide grating 114 and one wavelength per source. This downstream optical signal is then routed to one of the exit ports of the array-waveguide grating 114 and then via distribution fiber 104 delivered to the ONU 105 where it is routed to an optical receiver 115 via an optical coupler 117. A portion of the downstream optical signal is coupled to an optical source 116 via the same optical coupler 117. This portion is used to define the emission wavelength of the upstream optical signal emitted from the optical source 116. The emitted upstream optical signal is coupled via optical coupler 117 to the distribution fiber 104 in the upstream direction, coupled to the AWG 114 at the remote node 103 and finally coupled to the central office 101 via the trunk fiber 102. At the central office 101, the upstream optical signal is passed though the AWG 113 and then directed towards the receiver 111 using the circulator 112. The optical signal emitted by the optical source 110 is modulated externally with downstream data, while the upstream optical signal emitted by the optical source 116 is detected and converted to electrical signal at the receiver 111. The element of network 100 that makes it a wavelength-reuse network is that the peak wavelength of the downstream optical signal is substantially equal to the peak wavelength of the upstream optical signal. In wavelength reuse architectures, the two wavelengths *upstream and downstream) are sufficiently close so that both of them fit into the same passband of same channel within the same diffraction order of the AWG.

SUMMARY

A fiber-optic transmitter averages, amplifies, and re-modulates optical signals of an arbitrary wavelength arriving at its single port and emits re-modulated optical signal through the same port. In one embodiment, this transmitter gives rise to a self-seeding passive optical network based on wavelength-division multiplexing with improved performance and in another embodiment is paired with a fiber-optic receiver to form a wavelength-reuse fiber-optic transceiver and used in optical networks with wavelength reuse.

BRIEF DESCRIPTION OF THE INVENTION

In wavelength reuse transceivers one attempts to match the peak wavelength of the output going optical signal (upstream) to the peak-wavelength of the downstreaming optical signal. For the purposes of this disclosure, a transceiver comprises a transmitter and a receiver. It should be understood that for this reason wavelength-reuse transmitter embodiments also give rise to unique wavelength-reuse transceiver embodiments. This application discloses four different wavelength-reuse transmitters with modulation averaging embodiments. Functionality of all four embodiments comprises averaging the modulated downstream optical signal using a modulation-averaging structure, amplification, and re-modulation with new data before it is sent upstream. The removal of the optical-signal modulation is performed using a modulation averaging structure (MAS), the amplification using a semiconductor optical amplifier (SOA) or a reflective semiconductor optical amplifier (RSOA), while the re-modulation of the averaged signal is performed using either by direct modulation of the optical signal in the mentioned semiconductor optical amplifiers (SOA or RSOA) or by using a modulator. The SOA is a two port optical amplifier that is bidirectional. An optical signal inserted from a first port will come out amplified on the second port, and similarly, an optical signal inserted from the second port will come out amplifier from the first port. The modulator may be an electro-absorption modulator, a Mach-Zehnder modulator, or any other type of optical modulator.

This application discloses embodiments that can be categorized into four categories divided by amplification approach, which can be bidirectional or unidirectional and by modulation averaging approach which can also be bidirectional or unidirectional. Only for the purpose of giving clarity to the disclosure, the embodiments (and categories) of wavelength-reuse transmitters with modulation averaging are coded using two-letter combinations: B-B for bidirectional amplification and bidirectional modulation averaging, B-U for bidirectional amplification and unidirectional modulation averaging, U-B for unidirectional amplification and bidirectional modulation averaging, and U-U for unidirectional amplification and unidirectional modulation averaging. Unidirectional amplification refers to an arrangement in which the optical signal passes through the amplification medium only in one direction, while bidirectional amplification refers to an arrangement in which the amplification is performed while the optical signals pass through the amplification medium in two (opposite) directions. Similarly, unidirectional modulation averaging refers to an architecture in which the optical modulation in an optical signal is performed when the optical signal passes through an optical modulation averaging structures in one direction, while in a bidirectional modulation averaging, the optical signal is averaged while passing through the optical modulation averaging structures in two (opposite) directions. A modulation averaging structure terminated with a high-reflectivity mirror, also referred to as an optical modulation reflector, is a bidirectional modulation averaging structure.

In all embodiments of wavelength-reuse transmitters with modulation averaging an optical signal is fed to the optical transmitter, the optical modulation of the incoming signal is averaged and converted to near-Gaussian noise using an optical modulation averaging structure described in U.S. Pat. Nos. 8,559,775 and 8,970,945, and U.S. patent application Ser. No. 14/841,710. The specific assumptions and properties of modulation averaging structures are described in the section on the detailed description of the invention.

AWG used in this disclosure have one common port and a multiplicity of distribution ports. The AWG path from the common port to any one of the distribution ports is a narrow bandpass filter with center wavelength generally defined by the ITU. The separation between the center wavelengths of the distribution ports (center wavelength pitch) is generally standard also defined by the ITU, for example, 200 GHz, 100 GHz, 50 GHz, and 25 GHz. As the wavelength pitch gets smaller the number of channels increases and presently ranges from 16 to 96 channels.

DETAILED DESCRIPTION OF THE INVENTION

Optical Modulation Averaging Structures

Figure 1:
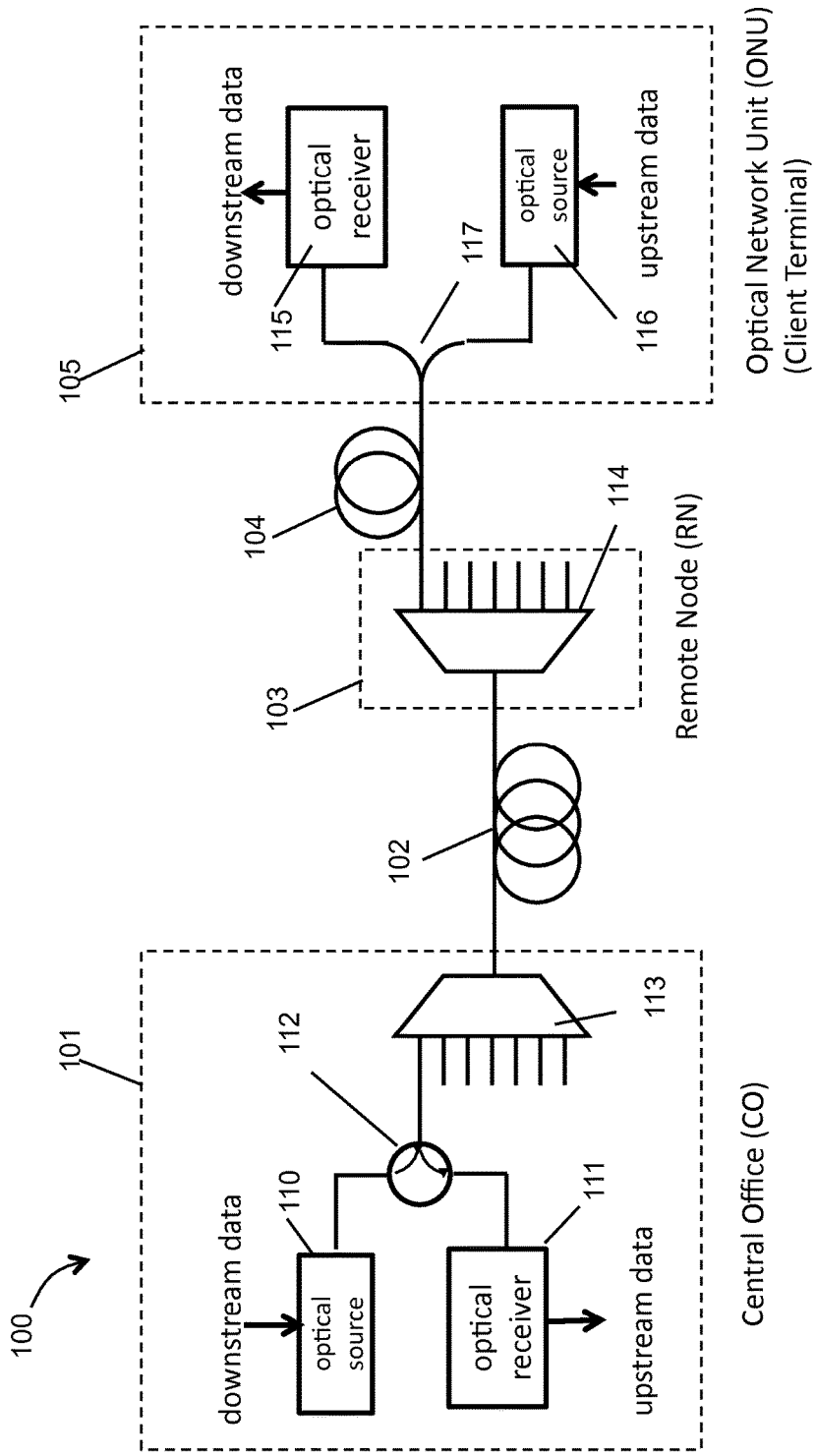
FIG. 1: (PRIOR ART) An example of wavelength-reuse WDM-PON architecture.

A modulation averaging structure is generally a reciprocal two-port optical component that averages intensity modulation in an optical signal in which the information is encoded in optical intensity with periodic modulation with symbol rate B equal or greater than the modulation-averaging structure's design rate B. Intensity modulation refers to any amplitude modulation characterized by (i) the symbol state duration $\tau$, (ii) the number of intensity levels into which information is encoded, (iii) the frequency content, and (iv) the maximum runlength of the modulated optical signal. The number of symbol changes per second in a signal is referred to as symbol rate B. Symbol rate is also referred to as baud rate or modulation rate in digitally modulated signals and is measured in baud (Bd) or symbols/second. The symbol rate is related to, but should not be confused with, the bitrate which is the number of bits transmitted per second, because each symbol can represent several bits of data if multiple-level pulse-amplitude modulation is used, or less for some coding schemes. In a simple binary or on/off keyed digital signal commonly used in, for example, Gigabit Ethernet, the symbol state duration is equal to the bit duration, the number of intensity levels is two (PAM-2), while the frequency content is that of a 8B10B coding algorithm (maximum runlength equals five). In PAM-4 modulation scheme, the number of intensity levels is four, while the symbol state duration is one bit. The modulation averaging reflector is useful for averaging the modulation in any of the mentioned modulation schemes, but also in modulation schemes not explicitly mentioned above.

Modulation averaging is accomplished by constructing waveguide structures in which delayed versions of the incident optical signal (symbol stream) are repeatedly added with lower amplitude. Since the bit sequence is generally random, the perpetual addition of the delayed sections of a random signal average the symbol stream resulting in an optical signal whose intensity distribution is a single normal (Gaussian) distribution rather than two sharp bell-shaped distribution characteristic for a zero-one bit stream. The repeated adding of delayed replicas of the incident optical signal is possible within the modulation averaging structure by splitting the optical power of the incident signal and redirecting it into waveguide sections that exhibit different delays and then combining the delayed sections. The elements that perform the splitting and combining are referred to as energy coupling elements. In one embodiment, the splitting and combining of optical power is realized using partially transmitting mirrors embedded within the waveguide, in other words, the energy coupling element of this embodiment is a partially transmitting mirror. In another embodiment, the splitting and combining of optical power is realized using optical couplers, in other words, the energy coupling element of this embodiment is an optical coupler. The embodiments disclosed in this application will be illustrated using optical couplers, but it is clear that other energy storage elements may be used for the same purpose without departing from the spirit of the invention.

The key design parameter for any modulation averaging structure is the "design time" denoted with $\xi$ and it spatial equivalent "design distance" $L_\xi = v_g \cdot \xi$, where $v_g$ is the group velocity in the waveguide. The reciprocal of the design time is the design rate $B_\xi = 1/\xi$ of a modulation averaging structure. A modulation averaging structure generates multiple (attenuated) replicas of the incident signal wherein the replicas are repeated attenuated and delayed by time equal to integer multiplicity of the design time. If the symbol duration $\tau$ equals the design time $\xi$, sequences of symbols will be added to each other which will result in averaging of the modulating signal. Under this condition, portions of the incident modulated optical signal are repeatedly delayed by an integer number of symbol durations and finally summed before exiting the modulation-averaging reflector. In an ideal situation, the perpetual summation relies on the fact that optical power of signals always add regardless of the phase, which is possible when symbol duration is much greater than the coherence time of the optical signal as discussed in the text below. Modulation averaging structures are also effective when the symbol rate B is different from the design rate $B_\xi$. The averaging properties of the modulation-averaging reflector persist substantially unchanged (averaging principle does not change) for bit rates B that are an integer multiple of the design rate, namely, $B = q \cdot B_\xi$, where q is a positive integer ($q \in N$). It has been observed experimentally and confirmed theoretically that the modulation averaging structure designed so that all replicas repeat every $\xi$ can be also used at symbol rates that are not an integer multiple of the design rate $B_\xi$. In addition, the averaging structures may be designed with varying design times. Namely, all of the delay times do not necessarily have to be multiples of the design time.

The transmission through the passband of an AWG takes a shape that is determined by the AWG design. The power-spectral density, or commonly referred to as optical spectrum of the transmitted signal has a coherence time, coherence length, and linewidth that are determined by the shape of the AWG filter passband.

The degree to which the reduction in modulation is possible depends on the architecture of the modulation averaging structure. Modulation averaging structure is generally a two port optical component, but may have more than two ports. Terminating one of the ports of a two-port modulation averaging structure with a high-reflectivity mirror creates a modulation averaging reflector, which is a single-port optical component (one port is terminal and one port still accessible).

Two-port modulation averaging structures can be unidirectional or bidirectional. Unidirectional structures have the property that a signal incident on any and all ports exhibits no (or negligible reflection) back to the same port (provided that the other ports are open and no external reflection feeds energy back into the structure). A unidirectional modulation averaging structure can be used in the bidirectional wavelength-reuse transmitter as the signal can be made to propagate through the unidirectional modulation averaging structure in both directions. In one embodiment, modulation averaging structure utilizes optical fibers and a multiplicity of four-port optical couplers.

Figure 3:
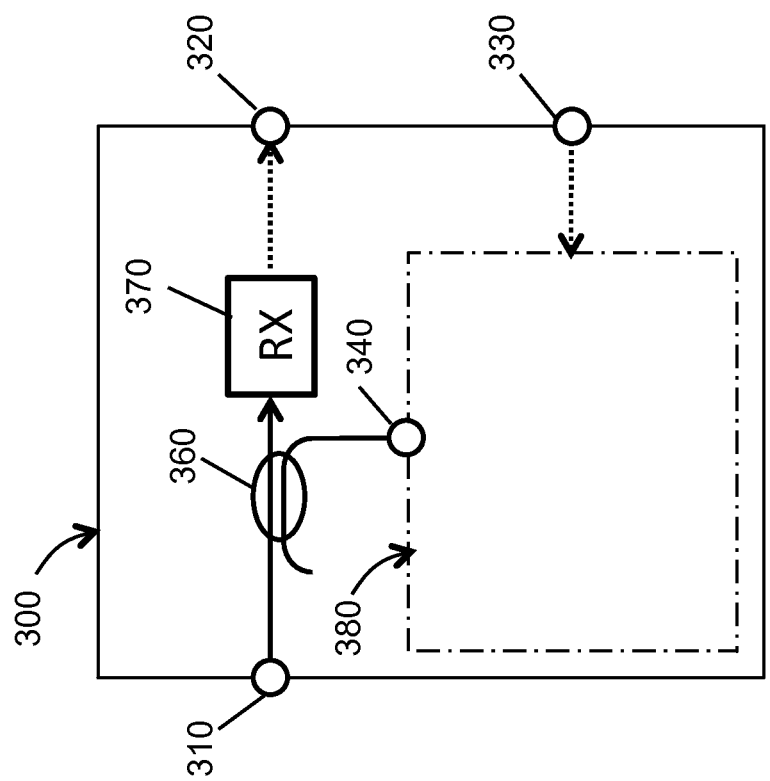
FIG. 3: A wavelength-reuse transceiver with modulation averaging.
Figure 7:
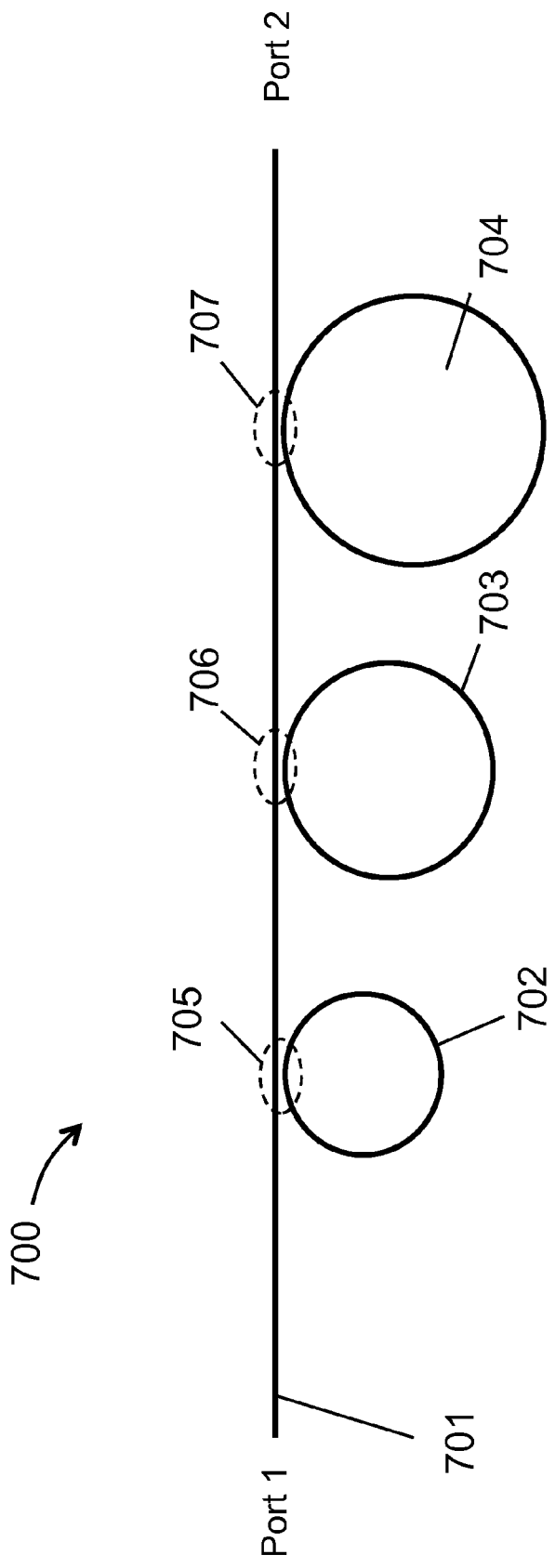
FIG. 7: One embodiment of a coupler-based modulation averaging structure.

FIG. 7 illustrates an optical-coupler-based modulation averaging structure as described in U.S. patent application Ser. No. 14/841,710. Exemplary modulation averaging structure 700 comprising three four-port optical couplers 705, 706, and 707, and three fiber rings 702, 703, 704 use high directivity optical couplers with very little reflections. For this reason, the modulation averaging structures of the architecture shown in FIG. 3 are unidirectional for all practical purposes. It is clear that the modulation averaging structure shown in FIG. 7 is only an example and that many other averaging structure can be formed using optical fiber loops, couplers, and in-fiber reflectors. For the purposes of this application, modulation averaging structures and reflectors mean all structures, dimensional variations and optimizations disclosed in co-pending patent application Ser. No. 14/841,710 and U.S. Pat. Nos. 8,559,775 and 8,970,945. This furthermore includes variations of the modulation averaging structures with any number of optical couplers, any number of fiber loops and their perimeter and any optical coupler ratio combination for those modulation averaging structures and reflectors.

High-Reflectivity Mirrors and Anti-Reflective Coatings

Some embodiments disclosed in this application rely on high reflectivity optical mirrors that exhibit high reflectivity. It is well known in the art that high-reflectivity mirrors are realized as quarter-wave stacks of thin films and that reflectivities in excess of 90% or approaching 99.9% can be achieved in this manner for most wavelengths of interest in optical communications. Such mirrors are realized as interference filters and they can exhibit high reflectivity for one range of wavelengths and low reflectivity in another.

Optical Circulators

Optical circulators and isolators are well known multiport passive optical components used to pass optical signals from one port (A) to another (B), while preventing signals incident on port B to reach port A. An isolator is a two-port device that passes an optical signal incident on port 1 to port 2 with minimal insertion loss, while it prevents a signal incident on port 2 to reach port 1, the insertion loss can be greater than 30 or 40 dB in this opposite direction.

A three-port circulator, a signal is transmitted from port 1 to port 2, but not from port 2 to port 1, another signal can be transmitted from port 2 to port 3, but not from port 3 to port 2. In this application, when speaking of a three-port circulator we refer to port 2 as the "center port" or "main port", port 3 as the "transmit port", and port 3 as the "return port".

A four-port circulator, a signal is transmitted from port 1 to port 2, but not from port 2 to port 1, another signal can be transmitted from port 2 to port 3, but not from port 3 to port 2, a third signal can be transmitted from port 3 to port 1, but not from port 1 to port 3, and finally a fourth signal can be transmitted from port 4 to port 1. In this application, when speaking of a four port circulator, we will use port numbering as stated above.

Isolators and circulators are generally realized using bulk optics or in micro-optics and are available fiber-coupled and fiber-optic components.

Semiconductor Optical Amplifiers

An optical amplifier is a device that amplifies an optical signal directly, without the need to first convert it to an electrical signal. The amplification or gain of the amplifier is controlled by an electric current or pump light intensity. The amplification of light is commonly done in fiber giving rise to fiber amplifiers, such as, erbium-doped fiber amplifiers (EDFA). Light amplification in semiconductors gives rise to semiconductor optical amplifiers (SOA) and the gain can be modulated using electric current. Optical amplifiers have two ports: an input and an output port. In some architectures, one port of an SOA may be terminated with a high-reflectivity mirror in which case the amplifier is referred to as a reflective semiconductor optical amplifier (RSOA). Semiconductor optical amplifiers are well known in the art and are described in publicly available texts, such as, N. Dutta and Q. Wang, Semiconductor Optical Amplifiers, published by World Scientific, Singapore, 2013.

Wavelength-Reuse Transmitter Embodiments

Exemplary illustration of four different embodiments of wavelength-reuse transmitters are shown in FIG. 2.

Wavelength-Reuse Transmitter Embodiments: Bidirectional-Bidirectional

Figure 2A:
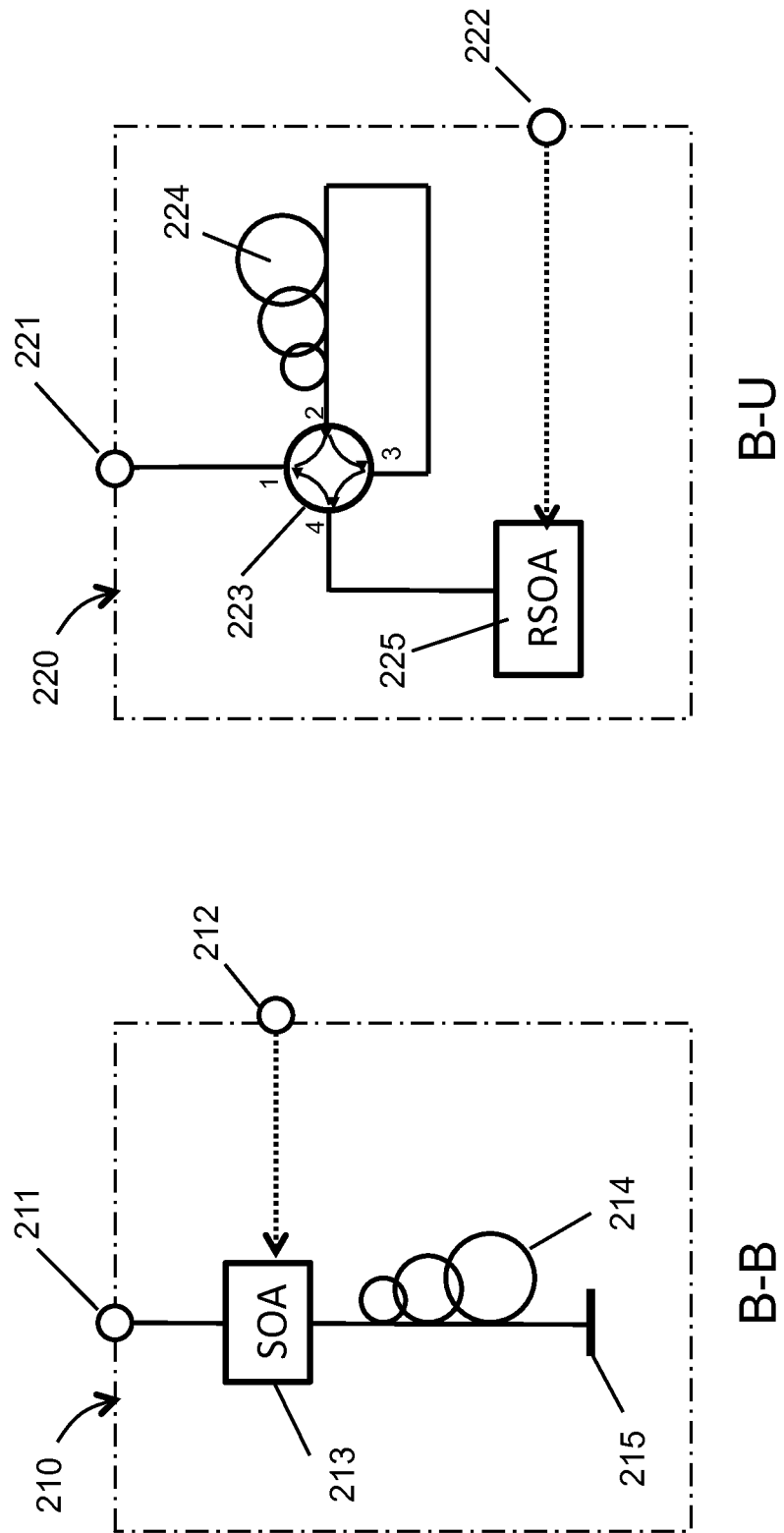
FIG. 2A: Schematic of wavelength reuse transmitter embodiments B-B and B-U.

Wavelength-reuse transmitter with modulation averaging 210 of the type B-B (bidirectional-bidirectional), shown in FIG. 2A, comprises of a fiber port 211 through which a sample downstream signal arrives and upstream optical signal leaves the transmitter 210, and electrical input port 212 to which an electrical signal with upstream data is fed. The transmitter 210 comprises of a semiconductor optical amplifier 213 ("SOA") and a modulation averaging structure 214 and high-reflectivity mirror 215. The combination 214 and 215 form a modulation-averaging reflector as discussed above. Upstream data modulating the upstream optical signal is electrically coupled to the SOA 213 via an electrical port 212.

The principle of operation is as follows: optically modulated downstream signal arrives to fiber port 211 is amplified and re-modulated with the upstream data sequence brought in via electrical port 212 then averaged at the modulation averaging reflector (combination of the MAS 214 and high-reflectivity mirror 215). Upon returning from the reflector 214/215, the optical signal is devoid of optical modulation and it only has noise, it is now amplified and modulated again at the SOA 213. In this embodiment, the downstream optical signal is averaged by passing through the MAS twice (bidirectional averaging) and amplified twice (bidirectional amplification).

Wavelength-Reuse Transmitter with Modulation Averaging Embodiments: B-U

Wavelength-reuse transmitter with modulation averaging 220 of the type B-U (bidirectional-unidirectional) shown in FIG. 2A comprises of a fiber port 221 through which modulated downstream optical signal arrives to the transmitter 220 and upstream optical signal leaves the transceiver 220, and electrical input port 222 to which an electrical signal with upstream data is fed. The wavelength-reuse transmitter 220 comprises of a four-port circulator 223, a modulation averaging structure 224, and a reflective semiconductor optical amplifier 225 ("RSOA"). Upstream data modulating the upstream optical signal is electrically coupled to the RSOA 225 via an electrical port 222.

The principle of operation is as follows: optically modulated downstream signal arriving to fiber port 221 is coupled to port 1 of the circulator 223 and routed to port 2. The modulated optical signal exiting from port 2 of the circulator 223 is passed through a modulation averaging structure 224 where it is averaged (modulation converted to noise) and input to port 3 and routed to port 4 of the circulator 223. The optical signal exiting port 4 has its modulation removed and converted to noise. This optical signal is now amplified and re-modulated with upstream data in the reflective semiconductor optical amplifier (RSOA) 225. The upstream modulation signal is delivered to the RSOA 225 via the electrical modulation port 222. The modulated optical signal returning from the RSOA 225 is input to port 4 and routed to port 1 of the circulator 223 from where it is coupled to the fiber port 221 as output to be used. In this configuration, modulation averaging happens in one direction, but the amplification and re-modulation in two directions; the optical signal passes through the RSOA in two directions.

Wavelength-Reuse Transmitter with Modulation Averaging Embodiments: U-B

Figure 2B:
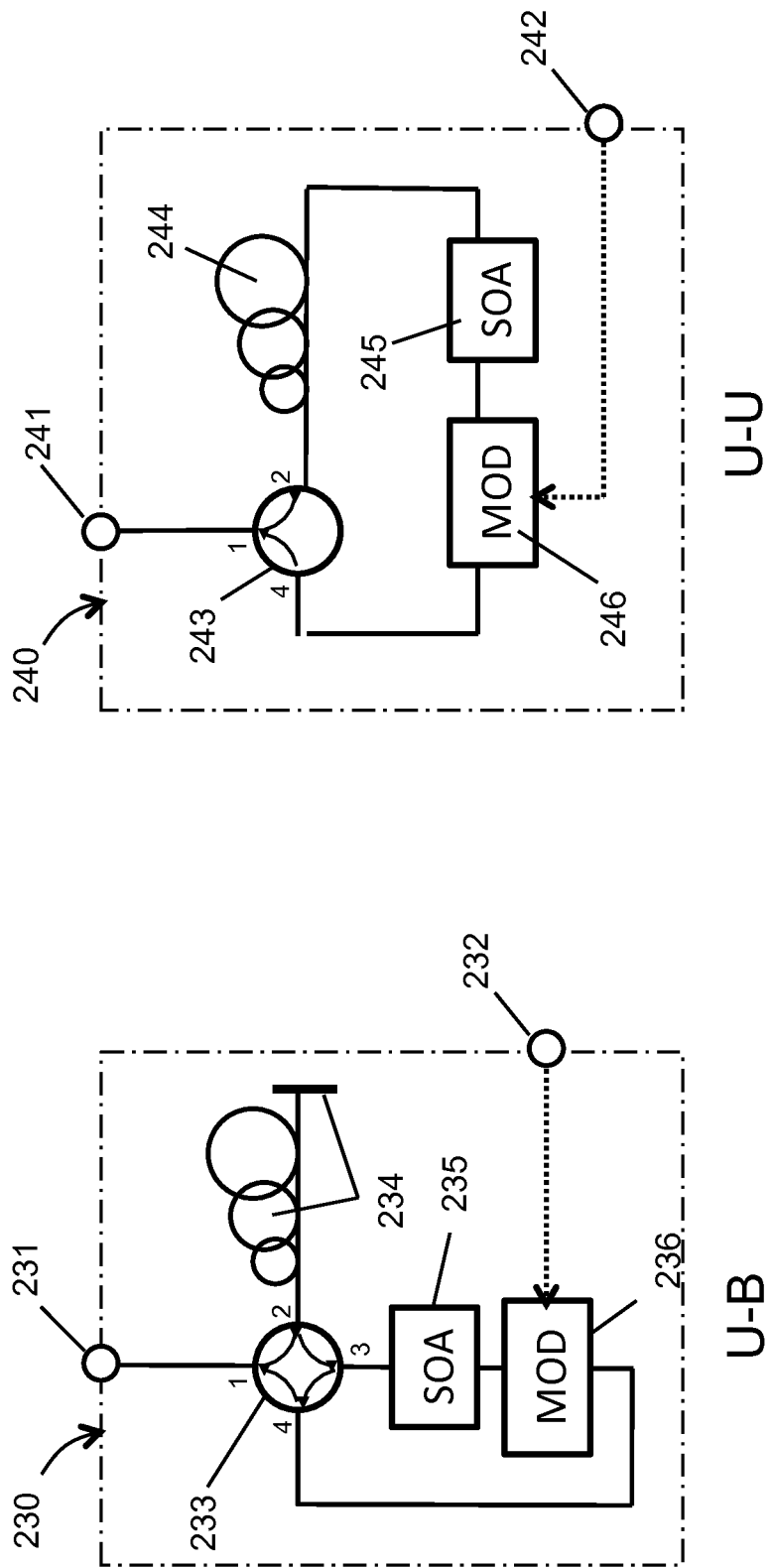
FIG. 2B: Schematic of embodiments U-B and U-U.

Wavelength-reuse transmitter with modulation averaging 230 of the type U-B (unidirectional-bidirectional) shown in FIG. 2B comprises of a fiber port 231 through which modulated downstream optical signal arrives to the transmitter 230 and upstream optical signal leaves the transmitter 230. The transmitter 230 comprises of a four-port circulator 233, a modulation averaging reflector 234 (it includes a modulation averaging structure and a high-reflectivity mirror), a semiconductor optical amplifier 235 ("SOA"), and a modulator 236 ("MOD"). Upstream data modulating the upstream optical signal is electrically coupled to the modulator 236 via electrical port 232.

The principle of operation is as follows: optically modulated downstream signal arrives to fiber port 231 is coupled to port 1 of the circulator 233 and routed to port 2 by the circulator 233. The modulated optical signal exiting from port 2 of the circulator 233 is passed through and reflected from modulation averaging reflector 234 where it is averaged (modulation converted to noise) and returned to port 2 of circulator 234 and routed to port 3 of the circulator 233. The optical signal exiting port 3 has its modulation removed and converted to noise. This optical signal is now amplified while passing through semiconductor optical amplifier 235 ("SOA") and then re-modulated in modulator ("MOD") 236 with upstream data brought in via electrical port 232. The modulated optical signal returning from the modulator 236 is input to port 4 and routed to port 1 of the circulator 233 from where it is coupled back to fiber port 231 as useful output. In this configuration, modulation averaging happens in two directions, but the amplification and re-modulation in one direction.

Figure 2C:
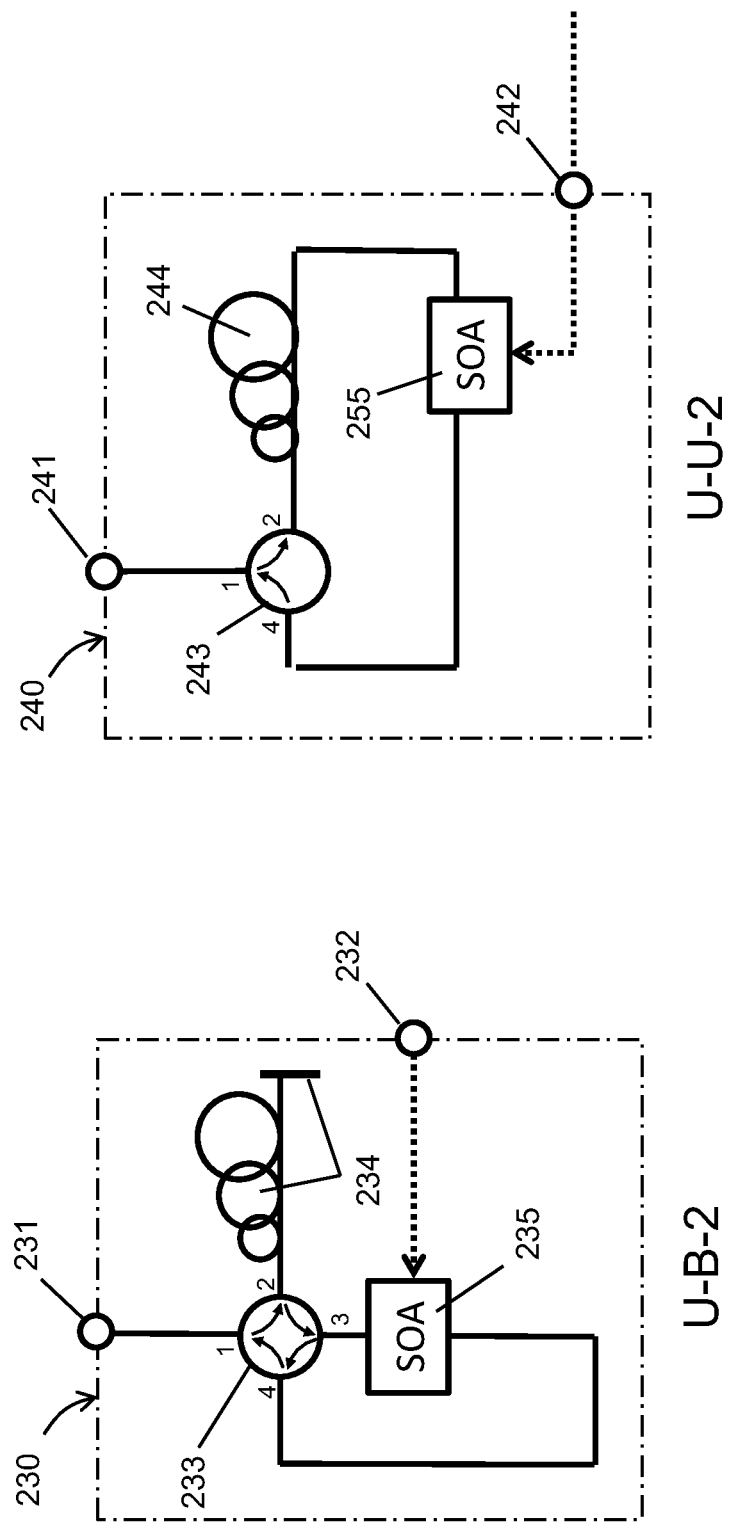
FIG. 2C: Schematic of embodiments U-B-2 and U-U-2.

In another embodiment, shown as embodiment U-B-2 in FIG. 2C, the modulator 236 is absent, the electrical port 232 is electrical coupled to the SOA 235 so that the light modulation occurs by direct modulation of the SOA 235.

Wavelength-Reuse Transmitter with Modulation Averaging Embodiments: U-U

Wavelength-ruse transmitter with modulation averaging 240 of the type U-U (unidirectional-unidirectional) comprises of a fiber port 241 through which modulated downstream optical signal arrives to and upstream optical signal leaves the transceiver 240. The transmitter 240 comprises of a three-port circulator 243, a modulation averaging structure 244, a semiconductor optical amplifier 245 ("SOA"), and modulator 246 ("MOD"). Upstream data modulating the upstream optical signal is electrical coupled to the modulator 246 via an electrical port 242.

The principle of operation is as follows: optically modulated downstream signal arrives to fiber port 241 is coupled to port 1 of the circulator 243 and routed to port 2 by the circulator 243. The optical signal exiting from port 2 of the circulator 243 is passed through a modulation averaging structure 244 where it is averaged (modulation converted to noise) and fed to the semiconductor optical amplifier 245 ("SOA") where it is amplified. The signal leaving the SOA 245 is now re-modulated with upstream data in the modulator 246. The upstream modulation signal is delivered to the modulator 246 via the electrical modulation port 242. The re-modulated optical signal leaving the modulator 246 is input to port 4 and routed to port 1 of the circulator 243 from where it is coupled to the fiber port 241 to be used as output. In this configuration, modulation averaging, amplification, and re-modulation happen in one direction.

In another embodiment, shown as embodiment U-U-2 in FIG. 2C, modulator 246 is absent, and the electrical port 242 is electrically coupled to the SOA 255 so that the light modulation occurs by direct modulation of the SOA 255.

For all four sets of embodiments disclosed above, the upstream data may be fed to the electrical input port 212, 222, 232, and 242 as analog modulation data or as digital data in which case digital to analog conversion occurs within the transmitters 210, 220, 230, and 240, respectively (not shown in FIG. 2A).

Wavelength-Reuse Transceivers with Modulation Averaging

In another set of embodiments, each of the wavelength-reuse transmitters with modulation averaging embodiments numbered 210, 220, 230, and 240 and shown in FIG. 2 form a wavelength-reuse transceiver with modulation averaging 300 illustratively shown in FIG. 3.

A wavelength-reuse transceiver with modulation averaging 300 comprises bidirectional fiber port 310, electrical input port 330, electrical output port 320, an optical coupler 360 coupling the bidirectional fiber port 310 with the receiver 370 and the wavelength-reuse transmitter block 380 via transmitter optical port 340. The coupling ratio of the optical coupler 360 is adjusted to optimize the ratio of light intensity needed for seeding the wavelength-reuse transmitter with modulation averaging 380 and needed to maintain desired bit-error rate in the receiver 370. The downstream signal is detected by the receiver 370 and data is output through electrical port 320, while the upstream data is fed to the transceiver electrical input port 330. The wavelength-reuse transmitter with modulation averaging block 380 comprises a fiber port 340 and electrical input 330 which correspond to the ports disclosed previously in connection with FIG. 2: Depending on which embodiment of the wavelength-reuse transmitter with modulation averaging is used (B-B, B-U, U-B, or U-U), ports 340 and 330 are coupled to ports 211 and 212, respectively, for configuration B-B, ports 221 and 222, respectively, for configuration B-U, ports 231 and 232, respectively, for configuration U-B, and ports 241 and 242, respectively, for configuration U-U.

Consequently, there are four different embodiments of the wavelength-reuse transceiver with modulation averaging 300 depending on which of the wavelength-reuse transmitter with modulation averaging embodiments (U-U, U-B, B-B, or U-B disclosed above).

Wavelength-Reuse Passive Optical Network

Figure 4:
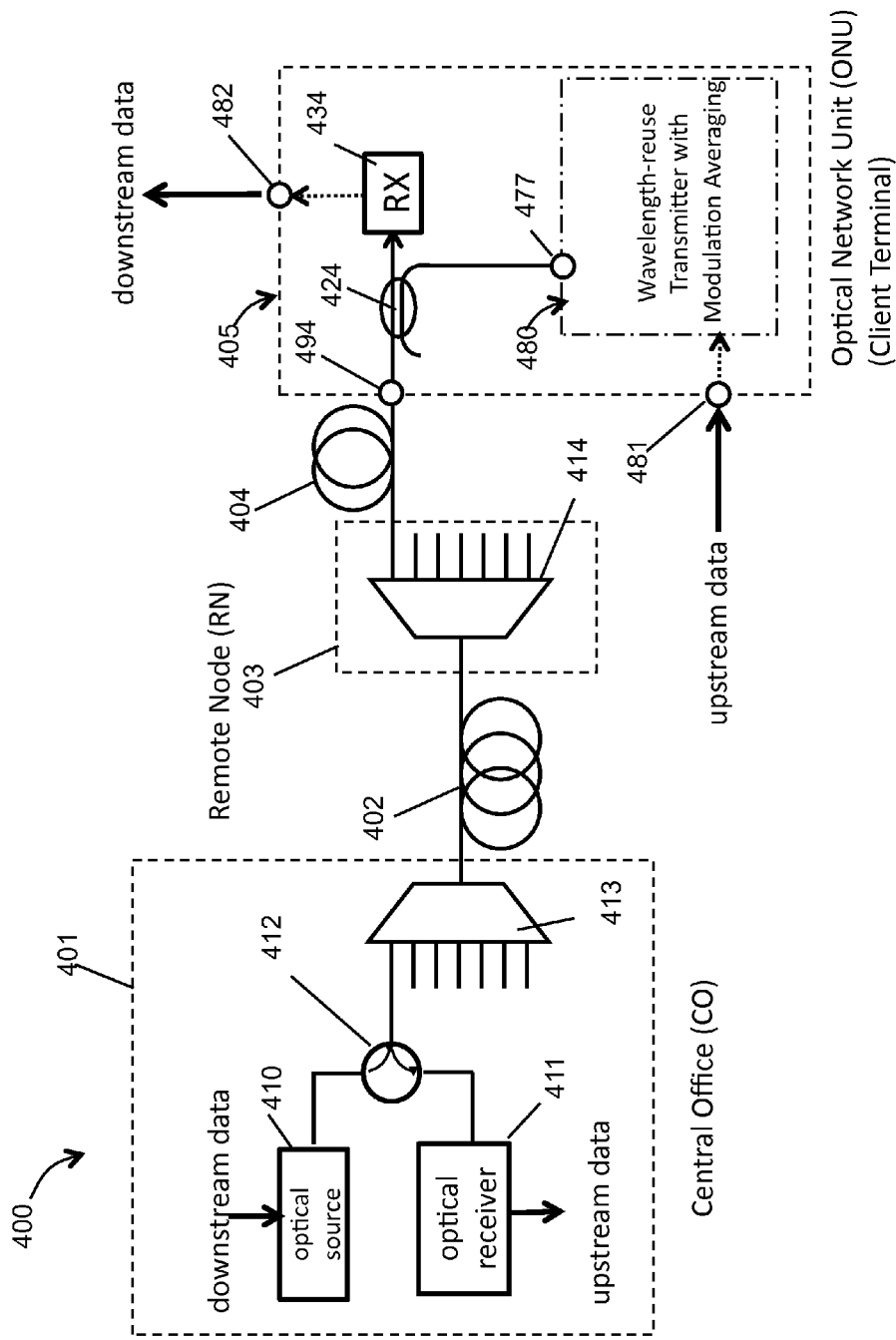
FIG. 4: An exemplary network architecture using wavelength reuse employing wavelength-reuse transceivers with modulation averaging.

FIG. 4 illustrates a wavelength-reuse passive optical network 400 employing a wavelength-reuse transceiver with modulation averaging 405 with U-U configured wavelength-reuse transmitter as an example.

One embodiment of an optical network using wavelength-reuse 400 comprises of a central office 401, trunk fiber 402, remote node 403, a distribution fiber 404, and at least one optical network unit 405 (also referred to as the client terminal). The central office 401 comprises of a multiplicity (only one is shown in FIG. 4) of optical sources 410 emitting a modulated optical signal that is passed through a circulator 412, coupled to one port of an array-waveguide grating 413 before it is emitted through the trunk fiber 402 over a distance to the remote node 403 where it is spectrally demultiplexed using an array waveguide grating 414. This downstream optical signal is then routed to one of the exit ports of the array-waveguide grating 414 and then via the distribution fiber 404 delivered to the fiber port 494 of the ONU 405.

In one embodiment, the ONU 405 is a wavelength-reuse transceiver with modulation averaging comprising an optical receiver 434, optical coupler 424, and a wavelength-reuse transmitter with modulation averaging 480. A portion of the downstream optical signal entering fiber port 494 is coupled to a receiver 434 using optical coupler 424, while the remaining optical signal is coupled to the wavelength-reuse transceiver with modulation averaging 480 via port 477. The downstream data is detected using the receiver 434 and delivered to the client via electrical port 482, while the client feeds upstream data via electrical port 481 to the transmitter 480. The upstream optical signal leaves the transmitter via fiber port 477 and is coupled to the transceiver 405 bidirectional port 494 from where it is routed to the central office 401 via the distribution fiber 404, remote node 403, and the trunk fiber 402. In the central office, the upstream signal is detected with an optical receiver 411, which then send out the detected upstream data to the central office.

Clearly, any one of the wavelength-reuse transmitters with modulation averaging disclosed above (B-B, B-U, U-B, or U-U) can be connected to the remote node 403, each to a different distribution port on the array-waveguide grating 414.

WDM Self-Seeded Optical Source with Extended Cavity and Modulation Averaging

Figure 5:
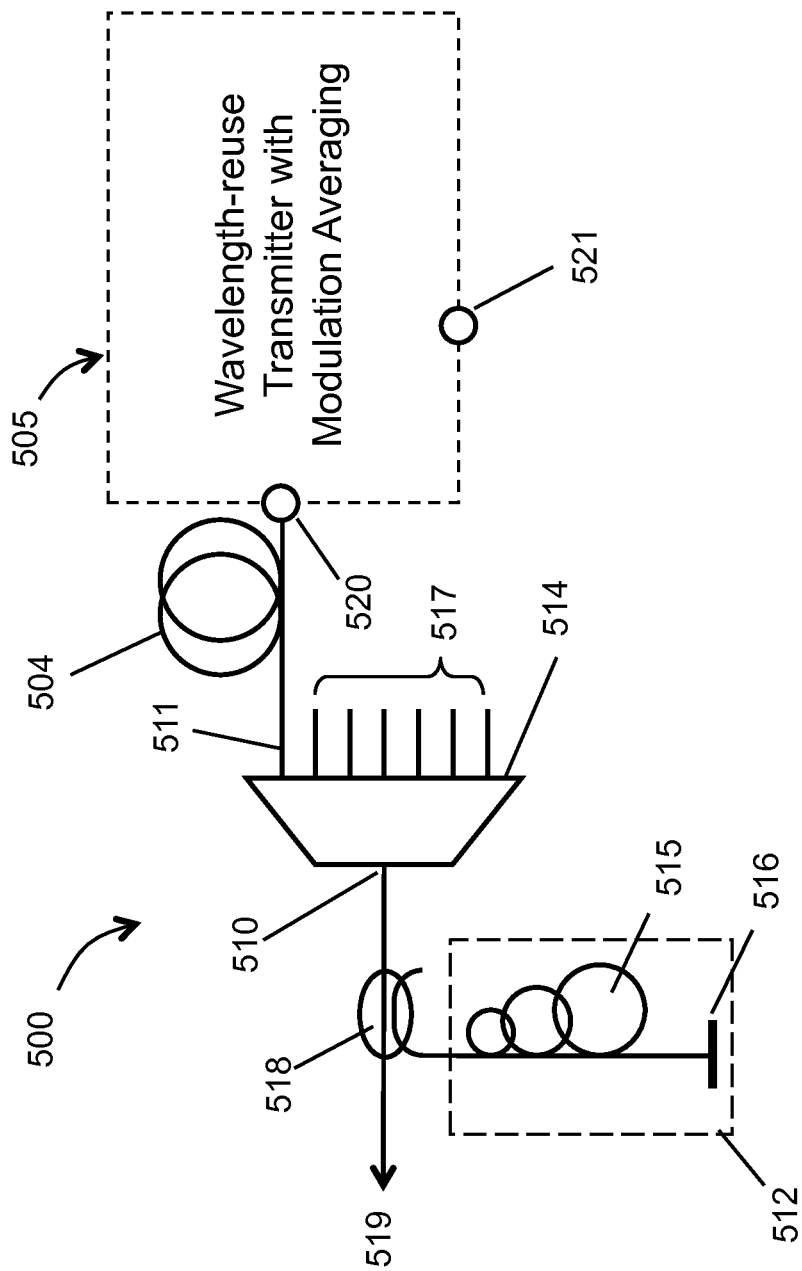
FIG. 5: A multi-wavelength optical source using an AWG, wavelength-reuse transmitter with modulation averaging.

FIG. 5 illustrates an exemplary wavelength-division multiplexed optical source 500 based on modulation averaging. The optical source 500 comprises a wavelength-reuse transmitter with modulation averaging 505 optically coupled to one distribution port 511 of an array-waveguide grating 514 via a segment of a fiber 504, an optical coupler 518 coupled to the common port of array-waveguide grating 510, a reflector 512 comprising an optional modulation-averaging structure 515 terminated with high-reflectivity mirror 516, wherein the reflector 212 is optically coupled to the common port 510 via the optical coupler 518. The array-waveguide grating 514 comprises one common port 510 and a multiplicity of distribution ports 511 and 517.

The transmitter 505, the segment of fiber 504, AWG 514, optical coupler 518, the reflector 512 form an extended cavity within which light spontaneously emitted by the transmitter 505 is recirculated while it is also sequentially averaged (modulation removed), amplified, and modulated in the transmitter 505. The emission wavelength of the optical source 500 is determined by the choice of the passband wavelength of the AWG channel. The optical signal emitter emitted from this optical source at output port 519 may be modulated with upstream data fed directly to the transmitter 505 at the data input port 521.

Figure 6:
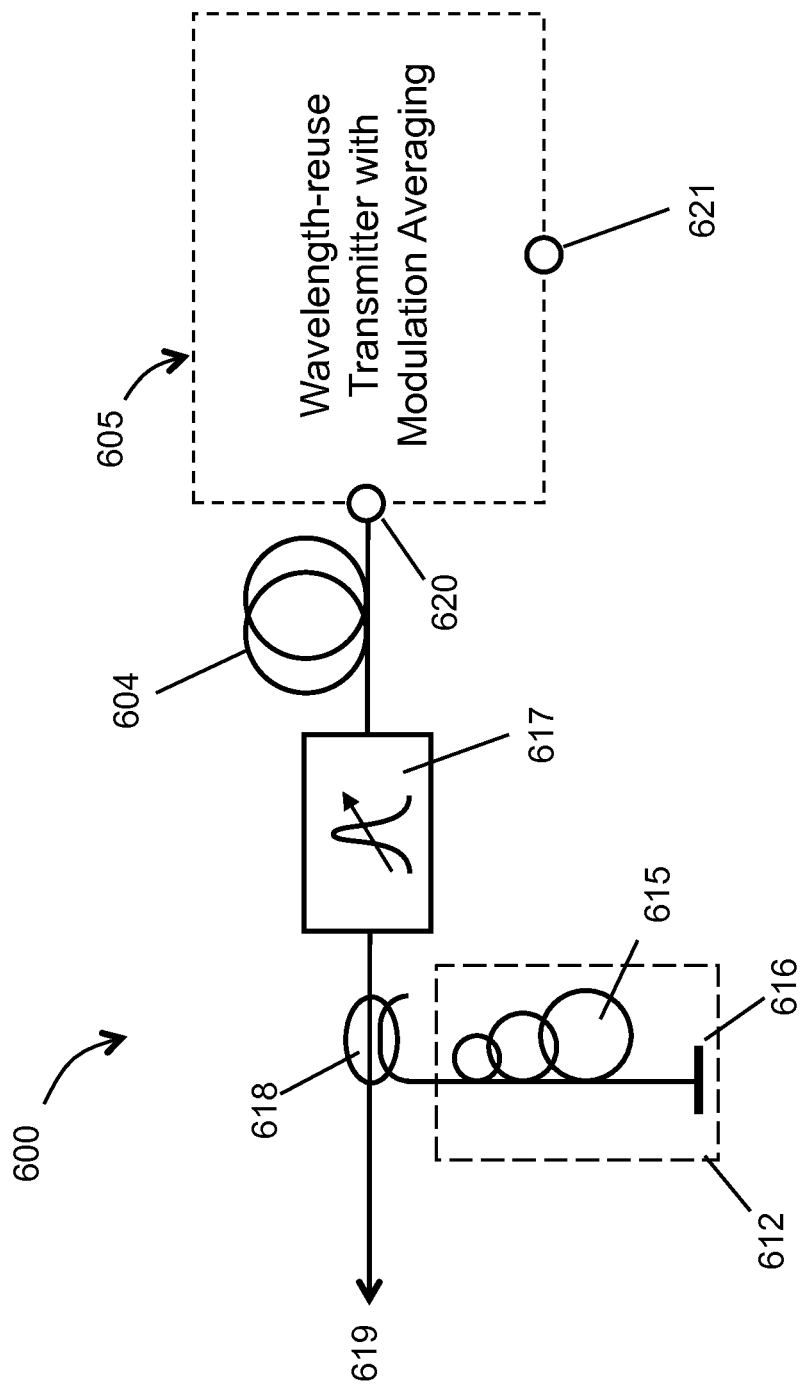
FIG. 6: A wavelength tunable optical source using a wavelength reuse transmitter with modulation averaging.

Any one of the wavelength-reuse transmitters with modulation-averaging disclosed above (U-U, U-B, B-U, and B-B) may be inserted in place of the dashed rectangle 505 shown in FIG. 6. Furthermore, in one embodiment the modulation averaging structure 515 is omitted, in another embodiment where structure 515 is present, the modulation-averaging structure within the wavelength-reuse transmitter 505 is omitted as for some cases it may be sufficient to average the modulation in only one place of the extended cavity.

Tunable Optical Source Using Modulation-Averaging

A continuously tunable optical source with an extended cavity may be formed using above-disclosed wavelength-reuse transmitters with modulation averaging by using a tunable passband filter rather than a fixed wavelength array-waveguide grating. The physical principles remain the same. These embodiments are disclosed with the help of FIG. 6.

In FIG. 6, a tunable optical source 600 comprises a wavelength-reuse transmitter with modulation averaging 605, an optional segment of optical fiber 604, a tunable bandpass filter 617, an output coupler 618, and a reflector 612 comprising an optional modulation averaging structure 615 and a high-reflectivity mirror 616. The output optical signal 619 from the optical source 600 is taken out from the output coupler 618.

The transmitter 605, the optical segment of fiber 604, AWG 614, optical coupler 618, the reflector 612 form an extended cavity within which light spontaneously emitted by the transmitter 605 is recirculated while it is also sequentially averaged (modulation removed), amplified, and modulated in the transmitter 605. If the modulation-averaging structure 615 is present then the modulation averaging would happen in two places: in structure 615 and in the transmitter 605. The emission wavelength of the optical source 600 is determined by the choice of the passband wavelength of the AWG channel. The optical signal emitter emitted from this optical source at output port 619 may be modulated with upstream data fed directly to the transmitter 605 at the data input port 621.

Any one of the wavelength-reuse transmitters with modulation-averaging disclosed above (U-U, U-B, B-U, and B-B) may be inserted in place of the dashed rectangle 605 shown in FIG. 6.

As described, this embodiment comprises two modulation averaging structures 615 and the one within the wavelength-reuse transmitter 605 (clearly visible in all embodiment of this transmitter disclosed above). In another embodiment, the modulation averaging structure 615 is omitted and the one within the transmitter 605 is kept. In yet another embodiment the modulation averaging structure within the transmitter 605 is emitted and the structure 615 is kept. The center wavelength of the tunable passband filter 617 may be adjusted mechanically, electro-optically, or thermally, using any one method known in the art.

The optical signal emitter emitted from this optical source at output port 619 may be modulated with upstream data fed directly to the transmitter 605.

General

It is clear to a person skilled in the art that any embodiment disclosed herein may be combined with any other embodiment disclosed in this application to optimize or adopt the inventions to their specific purpose. When singular is used, plural is possible without departing from the spirit of the invention.

It is clear that the presence of the modulation-averaging structures allows a wide variety of structural and architectural changes to the disclosed optical sources, transceiver, and transmitters. As disclosed above, in self-seeded passive-optical networks the modulation-averaging structures may be placed at more than one location in the network and may be placed in all of them depending on the practicality.

The selection between which wavelength-reuse transmitter with modulation averaging one should use in a particular application will depend on the cost, complexity and performance of the particular embodiment. For example, using fewer components, as shown in B-B embodiment, provides simplicity and direct modulation usable efficiently for lower data rates. Commercially available external modulators disclosed for other embodiments, on the other hand, allow very high modulation rates. Clearly, which embodiment is selected for us will depend on the specific requirements of the network or sensing equipment where they may be used.

We claim:

1. A fiber-optic transmitter comprising:
   a transmitter optical port;
   a semiconductor optical amplifier;
   an optical circulator with at least three ports, a first one of said three circulator ports optically coupled to said transmitter optical port;
   a fiber-optic modulator having a first optical port, a second optical port and an electrical modulation input port, said first optical modulator port being coupled to said semiconductor optical amplifier and said second modulator optical port being coupled to a second one of said three circulator ports; and
   a modulation-averaging structure optically coupled between said semiconductor optical amplifier and a third one of said three optical circulator ports.

2. The fiber-optic transmitter of claim 1, wherein said two-port modulation averaging structure comprises at least three four-port optical couplers and at least three fiber-optic segments mutually connected between said three four-port optical couplers.

* * * * *